(12) United States Patent
Pascolini

(10) Patent No.: US 8,532,697 B2
(45) Date of Patent: Sep. 10, 2013

(54) ELECTRONIC DEVICE WITH PASSIVELY COMBINED ANTENNAS

(75) Inventor: Mattia Pascolini, San Mateo, CA (US)

(73) Assignee: Apple Inc., Cupertino, CA (US)

( * ) Notice: Subject to any disclaimer, the term of this patent is extended or adjusted under 35 U.S.C. 154(b) by 36 days.

(21) Appl. No.: 13/117,050

(22) Filed: May 26, 2011

(65) Prior Publication Data

US 2012/0302282 A1    Nov. 29, 2012

(51) Int. Cl.
*H04M 1/00* (2006.01)

(52) U.S. Cl.
USPC ............... 455/550.1; 455/90.3; 455/575.1; 455/575.5; 455/575.7; 343/711

(58) Field of Classification Search
USPC ............ 455/550.1, 90.3, 575.5, 575.1, 575.7; 343/711
See application file for complete search history.

(56) References Cited

U.S. PATENT DOCUMENTS

| | | | |
|---|---|---|---|
| 5,175,878 A | 12/1992 | Davis et al. | |
| 6,259,687 B1 * | 7/2001 | Lomp et al. | 370/342 |
| 7,088,965 B1 * | 8/2006 | Ngan | 455/114.2 |
| 7,292,845 B2 | 11/2007 | Flannery | |
| 7,392,030 B2 * | 6/2008 | Sunaga | 455/277.1 |
| 8,159,412 B2 * | 4/2012 | Yun et al. | 343/890 |
| 8,208,980 B2 * | 6/2012 | Wong et al. | 455/575.5 |
| 2006/0232359 A1 * | 10/2006 | Fukuda et al. | 333/117 |
| 2006/0279467 A1 * | 12/2006 | LeMense et al. | 343/711 |
| 2008/0219377 A1 * | 9/2008 | Nisbet | 375/296 |
| 2008/0268803 A1 * | 10/2008 | Blin | 455/193.1 |
| 2011/0248791 A1 * | 10/2011 | Dupuy | 333/101 |
| 2012/0264387 A1 * | 10/2012 | Rofougaran et al. | 455/272 |

FOREIGN PATENT DOCUMENTS

JP    2003163956 A    6/2003

OTHER PUBLICATIONS

Caballero et al., U.S. Appl. No. 12/941,010, filed Nov. 5, 2010.
Simonite, "Dual Antennas Would Boost Cell-Phone Signals", MIT Technology Review, Aug. 12, 2010.

* cited by examiner

*Primary Examiner* — Sanh Phu
(74) *Attorney, Agent, or Firm* — Treyz Law Group; G. Victor Treyz; Jason Tsai

(57) ABSTRACT

Electronic devices may be provided that contain wireless communications circuitry. The wireless communications circuitry may include radio-frequency transceiver circuitry coupled to multiple antennas though a passive coupler. When transmitting signals, the passive coupler can divide transmitted signals between each of the multiple antennas. When using the antennas to receive signals, the received signals can be combined using the passive coupler. The combined signals may be provided to a receiver in the transceiver circuitry. A tap may be interposed in a path between the passive coupler and one of the antennas to monitor radio-frequency signal power. Phase-shift elements may be interposed in the paths between the antennas and the passive coupler to adjust the relative phase between signals associated with the first and second antennas.

18 Claims, 10 Drawing Sheets

|  | UNTOUCHED | LOWER TOUCHED | UPPER TOUCHED |
|---|---|---|---|
| LAT | 90% | 0% | 100% |
| UAT | 10% | 100% | 0% |

FIG. 6

ELECTRONIC DEVICE WITH PASSIVELY COMBINED ANTENNAS

BACKGROUND

This relates generally to wireless communications, and, more particularly, to electronic devices that have multiple antennas for supporting wireless communications.

Electronic devices such as portable computers and cellular telephones are often provided with wireless communications capabilities. For example, electronic devices may use long-range wireless communications circuitry such as cellular telephone circuitry and WiMax (IEEE 802.16) circuitry. Electronic devices may also use short-range wireless communications circuitry such as WiFi® (IEEE 802.11) circuitry and Bluetooth® circuitry.

Wireless electronic devices often have more than one antenna. For example, cellular telephones often use one antenna for handling one type of traffic such as cellular telephone traffic and use a separate antenna for handling a different type of traffic such as local area network traffic.

In some wireless devices, multiple antennas are used in parallel for handling the same type of data traffic. For example, a portable computer may use an array of multiple-input multiple-output antennas to handle IEEE 802.11n wireless local area network traffic. This type of arrangement may enhance throughput relative to arrangements that use only a single antenna, but requires the use of multiple parallel radio-frequency transceiver circuits. This can lead to increases in power consumption and device complexity.

It would therefore be desirable to be able to provide improved antenna arrangements for electronic devices.

SUMMARY

Electronic devices may be provided that contain wireless communications circuitry. The wireless communications circuitry may include radio-frequency transceiver circuitry coupled to antennas using a passive coupler. When transmitting signals, the passive coupler may serve as a divider that routes transmitted radio-frequency signals to respective antennas. When receiving signals, the passive coupler may serve as a signal combiner.

A tap may be interposed in one of the paths between the passive coupler and the antennas. A power detector may be coupled to the tap to make radio-frequency signal power measurements.

The performance of the wireless communications circuitry may be adjusted by forming one or more phase-shift elements in the paths between the passive coupler and the antennas.

The antennas may be formed at opposing ends of an electronic device housing. The electronic device housing may be associated with a portable electronic device such as a cellular telephone or other suitable electronic equipment that transmits and receives wireless signals.

Further features of the invention, its nature and various advantages will be more apparent from the accompanying drawings and the following detailed description of the preferred embodiments.

BRIEF DESCRIPTION OF THE DRAWINGS

FIG. 6 is a table showing how a pair of antennas may perform under various external object contact scenarios in accordance with an embodiment of the present invention.

DETAILED DESCRIPTION

Electronic devices may be provided with wireless communications circuitry. The wireless communications circuitry may be used in a portable electronic device or other electronic equipment. The wireless communications circuitry may have multiple antennas. For example, the wireless communications circuitry may have two antennas, three antennas, four antennas, or more than four antennas. The antennas may be combined using a passive coupler. Arrangements in which an electronic device is provided with two antennas that are combined with a passive coupler are sometimes described herein as an example. This is, however, merely illustrative. Any suitable number of antennas may be combined with a passive coupler to form the antenna structures in the wireless circuitry of an electronic device.

Figure 1:
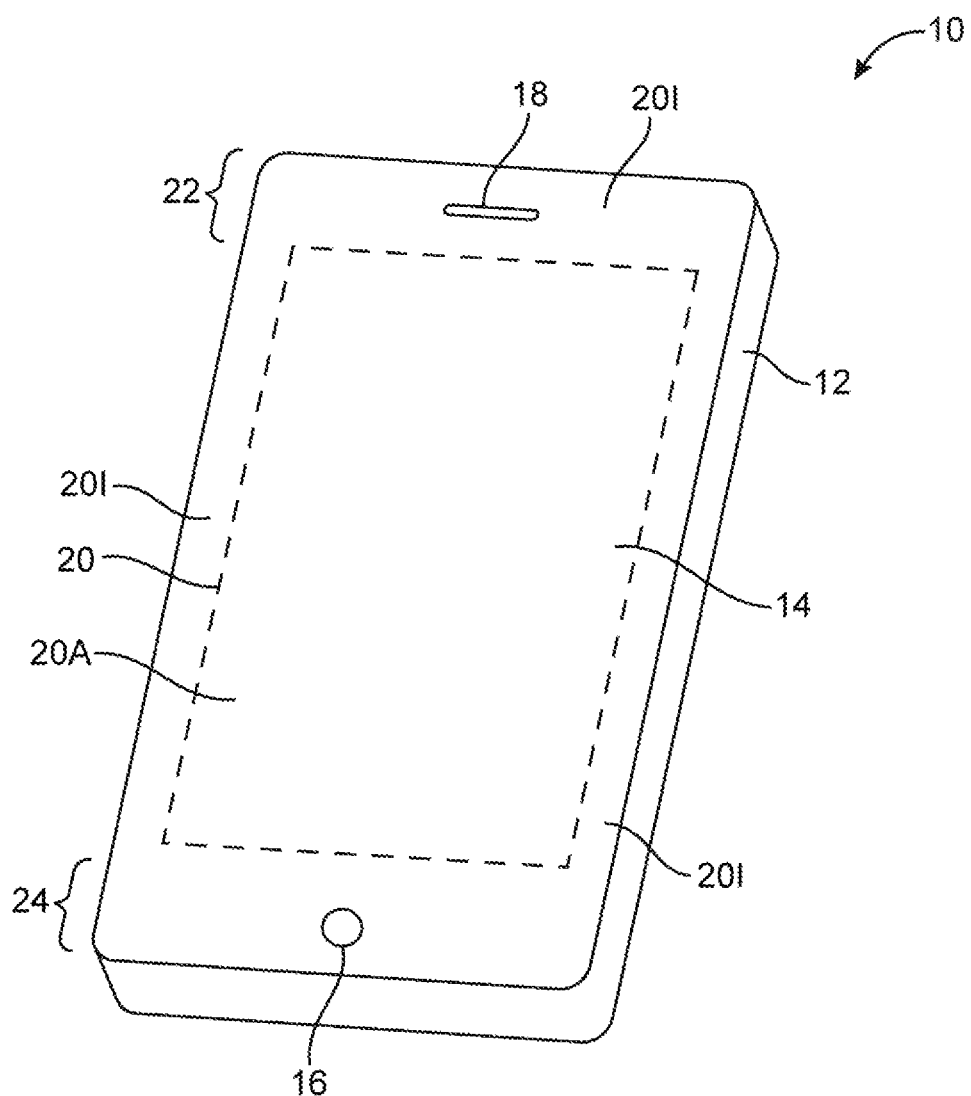
FIG. 1 is a perspective view of an illustrative electronic device with wireless communications circuitry with passively coupled antennas in accordance with an embodiment of the present invention.

An illustrative electronic device of the type that may be provided with an antenna that is formed from two or more antennas that have been combined with a passive coupler is shown in FIG. 1. Electronic device 10 may be a portable electronic device or other suitable electronic device. For example, electronic device 10 may be a laptop computer, a tablet computer, a somewhat smaller device such as a wristwatch device, pendant device, headphone device, earpiece device, or other wearable or miniature device, a cellular telephone, a media player, etc.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from metal elements.

Device 10 may, if desired, have a display such as display 14. Display 14 may, for example, be a touch screen that incorporates capacitive touch electrodes or other types of touch sensor. Display 14 may include image pixels formed from light-emitting diodes (LEDs), organic LEDs (OLEDs), plasma cells, electronic ink elements, liquid crystal display (LCD) components, or other suitable image pixel structures. A cover glass layer may cover the surface of display 14. Portions of display 14 such as peripheral regions 20I may be inactive and may be devoid of image pixel structures. Portions of display 14 such as rectangular central portion 20A (bounded by dashed line 20) may correspond to the active part of display 14. In active display region 20A, an array of image pixels may be used to display images for a user.

The cover glass layer that covers display 14 may have openings such as a circular opening for button 16 and a speaker port opening such as speaker port opening 18 (e.g., for an ear speaker for a user). Device 10 may also have other openings (e.g., openings in display 14 and/or housing 12 for accommodating volume buttons, ringer buttons, sleep buttons, and other buttons, openings for an audio jack, data port connectors, removable media slots, etc.).

Housing 12 may include a peripheral conductive member such as a bezel or band of metal that runs around the rectangular outline of display 14 and device 10 (as an example). The peripheral conductive member may be used in forming the antennas of device 10 if desired.

Antennas may be located along the edges of device 10, on the rear or front of device 10, as extending elements or attachable structures, or elsewhere in device 10. With one suitable arrangement, which is sometimes described herein as an example, device 10 may be provided with one or more antennas at lower end 24 of housing 12 and one or more antennas at upper end 22 of housing 12. Locating antennas at opposing ends of device 10 (i.e., at the narrower end regions of display 14 and device 10 when device 10 has an elongated rectangular shape of the type shown in FIG. 1) may allow these antennas to be formed at an appropriate distance from ground structures that are associated with the conductive portions of display 14 (e.g., the pixel array and driver circuits in active region 20A of display 14).

If desired, a first cellular telephone antenna may be located in region 24 and a second cellular telephone antenna may be located in region 22. Antenna structures for handling satellite navigation signals such as Global Positioning System signals or wireless local area network signals such as IEEE 802.11 (WiFi®) signals or Bluetooth® signals may also be provided in regions 22 and/or 24 (either as separate additional antennas or as parts of the first and second cellular telephone antennas). Antenna structures may also be provided in regions 22 and/or 24 to handle WiMax (IEEE 802.16) signals.

In regions 22 and 24, openings may be formed between conductive housing structures and printed circuit boards and other conductive electrical components that make up device 10. These openings may be filled with air, plastic, or other dielectrics. Conductive housing structures and other conductive structures may serve as a ground plane for the antennas in device 10. The openings in regions 22 and 24 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element such as an inverted-F antenna resonating element formed from part of a conductive peripheral housing structure in device 10 from the ground plane, or may otherwise serve as part of antenna structures formed in regions 22 and 24.

Antennas may be formed in regions 22 and 24 that are identical (i.e., antennas may be formed in regions 22 and 24 that each cover the same set of cellular telephone bands or other communications bands of interest). Due to layout constraints or other design constraints, it may not be desirable to use identical antennas. Rather, it may be desirable to implement the antennas in regions 22 and 24 using different designs. For example, the antennas in regions 22 and 24 may be implemented using different antennas types, may be implemented using designs that exhibit different gains, and/or may be implemented using designs that cover different frequency ranges.

Device 10 may use any suitable number of antennas. For example, device 10 may have two or more antennas, three or more antennas, four or more antennas, or five or more antennas. Two or more of these antennas may be coupled together using a passive coupler arrangement. Arrangements in which two antennas such as antennas in regions 22 and 24 of device 10 are combined in this way are sometimes described herein as an example, but additional antennas may be combined using passive coupler arrangements if desired. Device configurations in which two antennas are passively combined are merely illustrative.

The passively combined antennas can be used as a unitary antenna and are therefore sometimes collectively referred to as an "antenna" or "passively combined antenna structure or structures." Because the antennas are passively combined, the amount of switching circuitry that is used in device 10 (i.e., switching circuitry that might otherwise be used in actively switching a particular antenna or antennas in to use in real time) may be reduced. Components such as electrically controlled switches (i.e., switches whose states are controlled during device operation by control signals from device control circuitry) can exhibit non-linear behavior, which can lead to the production of undesired signal harmonics during operation. The presence of switches can also introduce signal losses. The ability to minimize or eliminate switches from an antenna signal path may therefore improve device performance by reducing harmonic noise and/or by extending battery life by reducing the need to transmit at elevated powers to compensate for insertion losses associated with one or more switches in the signal path.

Figure 2:
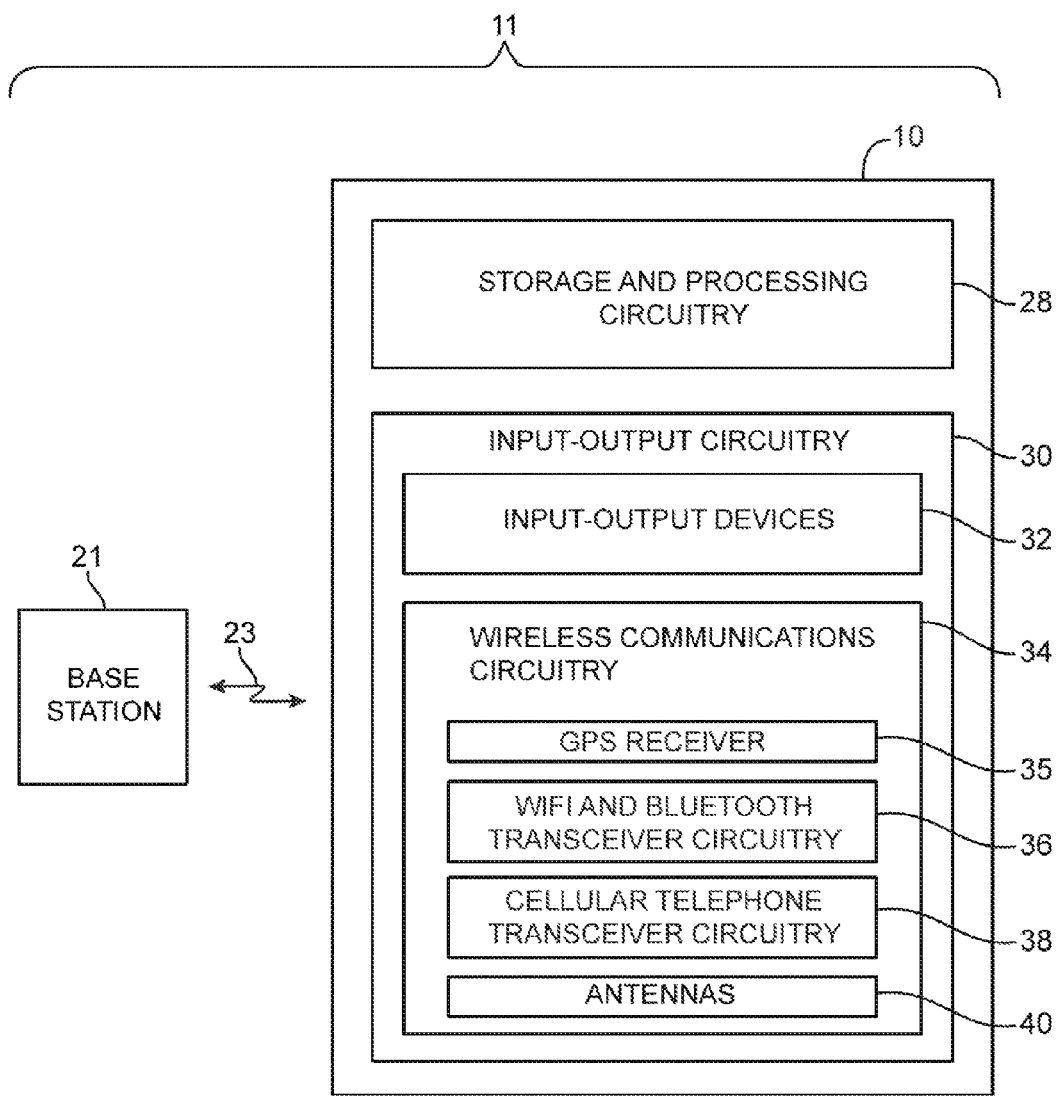
FIG. 2 is a schematic diagram of a system that includes an electronic device of the type that may be provided with passively combined antennas in accordance with an embodiment of the present invention.

A schematic diagram of a system in which electronic device 10 may operate is shown in FIG. 2. As shown in FIG. 2, system 11 may include wireless network equipment such as base station 21. Base stations such as base station 21 may be associated with a cellular telephone network or other wireless networking equipment. Device 10 may communicate with base station 21 over wireless link 23 (e.g., a cellular telephone link or other wireless communications link).

Device 10 may include control circuitry such as storage and processing circuitry 28. Storage and processing circuitry 28 may include storage such as hard disk drive storage, non-volatile memory (e.g., flash memory or other electrically-programmable-read-only memory configured to form a solid state drive), volatile memory (e.g., static or dynamic random-access-memory), etc. Processing circuitry in storage and processing circuitry 28 and other control circuits such as control circuits in wireless communications circuitry 34 may be used to control the operation of device 10. This processing circuitry may be based on one or more microprocessors, microcontrollers, digital signal processors, baseband processors, power management units, audio codec chips, application specific integrated circuits, etc.

Storage and processing circuitry 28 may be used to run software on device 10, such as internet browsing applications, voice-over-internet-protocol (VoIP) telephone call applications, email applications, media playback applications, operating system functions, etc. To support interactions with external equipment such as base station 21, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, IEEE 802.16 (WiMax) protocols, cellular telephone protocols such as the Long Term Evolution (LTE) protocol, Global System for Mobile Communications (GSM) protocol, Code Division Multiple Access (CDMA) protocol, and Universal Mobile Telecommunications System (UMTS) protocol, etc.

Circuitry 28 may be configured to implement control algorithms for device 10. The control algorithm may be used to control radio-frequency switching circuitry, transceiver circuitry, and other device resources. The control algorithm may also be used to activate and deactivate transmitters and receivers, to tune transmitters and receivers to desired frequencies, to compare measured device operating parameters to predetermined criteria, etc.

In some scenarios, circuitry 28 may be used in gathering sensor signals and signals that reflect the quality of received signals (e.g., received pilot signals, received paging signals, received voice call traffic, received control channel signals, received data traffic, etc.). Examples of signal quality measurements that may be made in device 10 include bit error rate measurements, signal-to-noise ratio measurements, measurements on the amount of power associated with incoming wireless signals, channel quality measurements based on received signal strength indicator (RSSI) information (RSSI measurements), channel quality measurements based on received signal code power (RSCP) information (RSCP measurements), reference symbol received power (RSRP measurements), channel quality measurements based on signal-to-interference ratio (SINR) and signal-to-noise ratio (SNR) information (SINR and SNR measurements), channel quality measurements based on signal quality data such as Ec/Io or Ec/No data (Ec/Io and Ec/No measurements), etc. This information and other data may be used in controlling how the wireless circuitry of device 10 is configured and may be used in otherwise controlling and configuring device 10.

Input-output circuitry 30 may be used to allow data to be supplied to device 10 and to allow data to be provided from device 10 to external devices. Input-output circuitry 30 may include input-output devices 32. Input-output devices 32 may include touch screens, buttons, joysticks, click wheels, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 32 and may receive status information and other output from device 10 using the output resources of input-output devices 32.

Wireless communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals.

Wireless communications circuitry 34 may include satellite navigation system receiver circuitry such as Global Positioning System (GPS) receiver circuitry 35 (e.g., for receiving satellite navigation system signals at 1575 MHz). Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as bands at 700 MHz, 850 MHz, 900 MHz, 1800 MHz, 1900 MHz, 2100 MHz, 2300 MHz, and other cellular telephone bands of interest. Wireless communications circuitry 34 can include circuitry for other short-range and long-range wireless links if desired (e.g., WiMax circuitry, etc.). Wireless communications circuitry 34 may, for example, include, wireless circuitry for receiving radio and television signals, paging signals, etc. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include antennas 40. Antennas 40 may be formed using any suitable types of antenna. For example, antennas 40 may include antennas with resonating elements that are formed from loop antenna structures, patch antenna structures, inverted-F antenna structures, closed and open slot antenna structures, planar inverted-F antenna structures, helical antenna structures, strip antennas, monopoles, dipoles, hybrids of these designs, etc. Different types of antennas may be used for different bands and combinations of bands. For example, one type of antenna may be used in forming a local wireless link antenna (e.g., for handling WiFi® traffic or other wireless local area network traffic) and antennas of one or more other types may be used in forming a remote wireless link antenna (e.g., for handling cellular network traffic such as voice calls and data sessions). As described in connection with FIG. 1, there may be one cellular telephone antenna in region 24 of device 10 and another cellular telephone antenna in region 22 of device 10. These antennas may be fixed or may be tunable.

Figure 3:
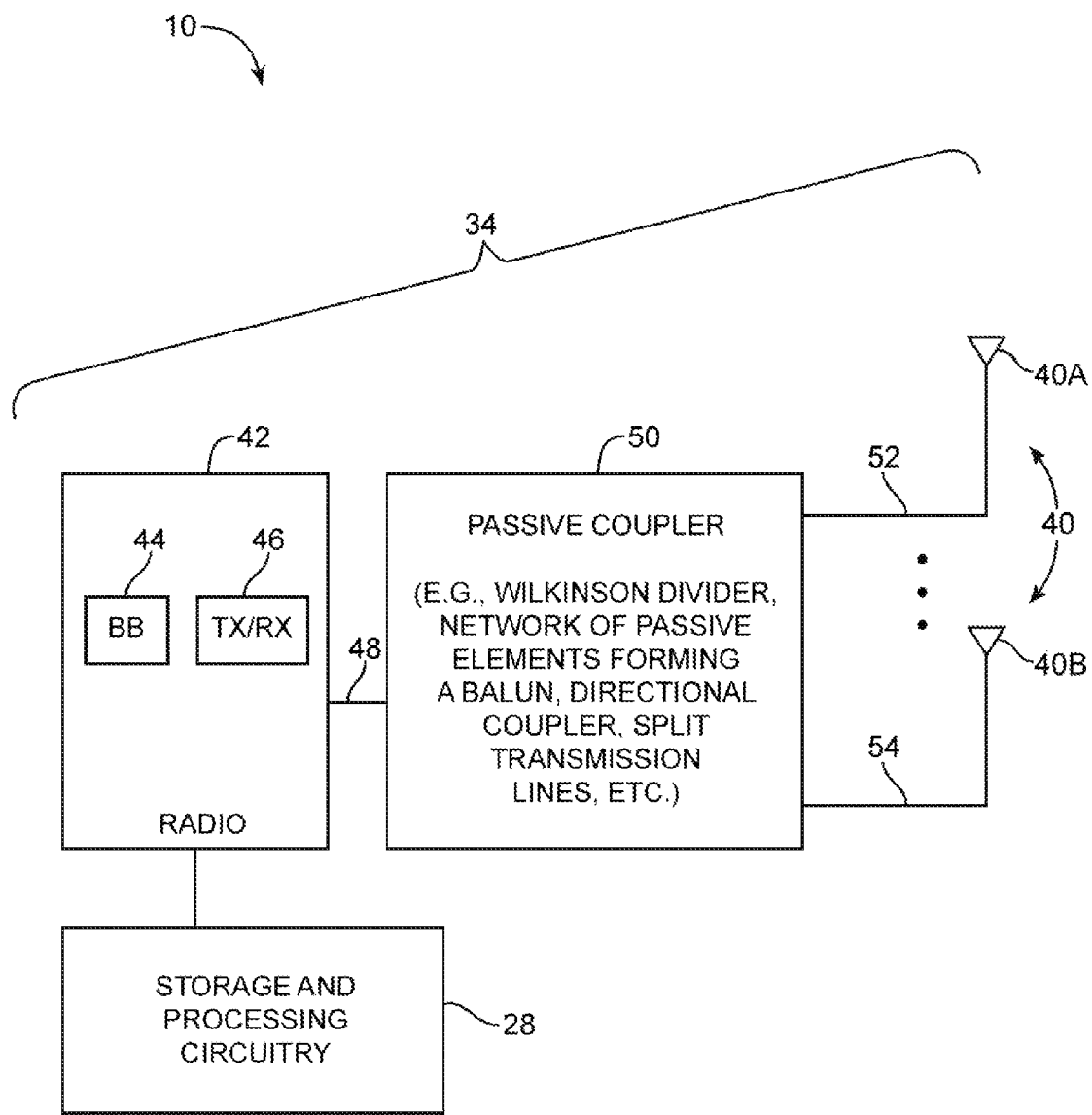
FIG. 3 is a circuit diagram showing how wireless circuitry in an electronic device may include multiple antennas that are coupled to radio-frequency transceiver circuitry through a passive coupler in accordance with an embodiment of the present invention.

Device 10 can be controlled by control circuitry that is configured to store and execute control code for implementing control algorithms. As shown in FIG. 3, the control circuitry of device 10 may include storage and processing circuitry 28 (e.g., a microprocessor, memory circuits, etc.). Control operations may also be performed using processing circuitry such as baseband processor 44 in radio (wireless) circuitry 42. Baseband processor 58 may include memory and processing circuits (i.e., baseband processor 58 may be considered to form part of the storage and processing circuitry of device 10). During operation of device 10, baseband processor 58 may provide data to storage and processing circuitry 28 (e.g., a microprocessor, nonvolatile memory, volatile memory, other control circuits, etc.).

Wireless circuitry 42 may include radio-frequency transceiver circuitry such as radio-frequency transceiver circuitry 46. Radio-frequency transceiver circuitry 46 may include one or more radio-frequency transmitters and one or more radio-frequency receivers. Filter and switching circuitry (e.g., duplexers, diplexers, switches, matching circuits, etc.) may be interposed between antennas 40 and the transmitter and receiver circuitry of transceiver circuitry 46 (e.g., to route incoming signals to desired receivers, to route transmitted signals from one or more transmitter circuits to antennas 40, to ensure impedance matching between antennas 40 and the transceiver and transmission line circuitry of wireless circuitry 42, etc.). In some embodiments, some or all of the paths between antenna elements and the radio-frequency transceiver circuitry may be free of switching circuitry and may use only passive elements (e.g., passive coupling circuitry).

During operation, baseband processor 44 may receive digital data that is to be wirelessly transmitted from storage and processing circuitry 28 and may use a transmitter (TX) in radio-frequency transceiver circuitry 46 and path 48 to transmit corresponding radio-frequency signals. Path 48 may be coupled between wireless circuitry (e.g., radio-frequency transceiver circuitry 46) and antennas 40 and may be used to convey the radio-frequency signals that are produced by radio-frequency transceiver circuitry 46 to antennas 40. When receiving antenna signals from antennas 40, path 48 may provide received antenna signals to a receiver (RX) in radio-frequency transceiver circuitry 46.

Passive coupler 50 may be used to combine antennas 40 such as antennas 40A and 40B to form a unitary passively combined antenna structure (antenna) for device 10. Path 52 may, for example, be coupled between a first port of passive coupler 50 and a first antenna in device 10 such as antenna 40A, whereas path 54 may be coupled between a second port of passive coupler 50 and a second antenna in device 10 such as antenna 40B. Path 48 may be coupled between transceiver 46 and a third port of passive coupler 50. Passive coupler 50 may also have a fourth port (e.g., a grounded port).

Paths 48, 52, and 54 may be based on transmission lines (e.g., one or more coaxial cables, microstrip transmission lines, stripline transmission lines, or other transmission line structures), impedance matching circuits, filters, and other circuitry.

Incoming radio-frequency signals that are received by antennas 40 may be provided to baseband processor 44 via paths 52 and 54, passive coupler 50, and path 48. When receiving signals, passive coupler 50 serves as a radio-frequency combiner that combines radio-frequency antenna signals from antenna 40A and path 52 with radio-frequency antenna signals from antenna 40B and path 54 and that provides corresponding combined radio-frequency signals to receiver RX in transceiver circuitry 46 on path 48. When transmitting signals from transmitter TX in transceiver circuitry 46 over path 48, passive coupler 50 serves as a radio-frequency splitter that divides the transmitted signals on path 48 and provides corresponding divided versions of the transmitted signals on respective paths 52 and 54. The portion of the transmitted signals that is supplied by passive coupler 50 to path 52 may be transmitted using antenna 40A. The portion of the transmitted signals that is supplied by passive coupler 50 to path 54 may be transmitted using antenna 40B.

By performing its combining and splitting functions, passive coupler 50 may be used to effectively combine discrete antenna elements such as antennas 40A and 40B into a unitary antenna (i.e., an antenna that is made up of a first antenna such as antenna 40A that is located at one end of device 10 and a second antenna such as antenna 40B that is located at an opposing end of device 10). In device configurations with more antennas to be combined, passive coupler 50 (e.g., a network of cascaded passive coupling circuits) may be provided with additional ports. The arrangement of FIG. 3 in which passive coupler has a first port coupled to path 52, a second port coupled to path 54, and a third port coupled to path 48 is merely illustrative.

Passive coupler 50 may perform its signal routing functions without using switch elements (i.e., passive coupler 50 and paths 52 and 54 can be free of any electrically controlled switching circuitry). Examples of passive coupler designs that may be used in implementing passive coupler 50 include designs based on Wilkinson dividers (sometimes referred to as Wilkinson splitters), designs based on a network of passive elements such as inductors, capacitors, resistors, and transmission line structures, designs based on a balun circuit, designs based on a spilt transmission line, other designs, or circuit arrangements that include one or more portions of one or more of these designs.

Figure 4:
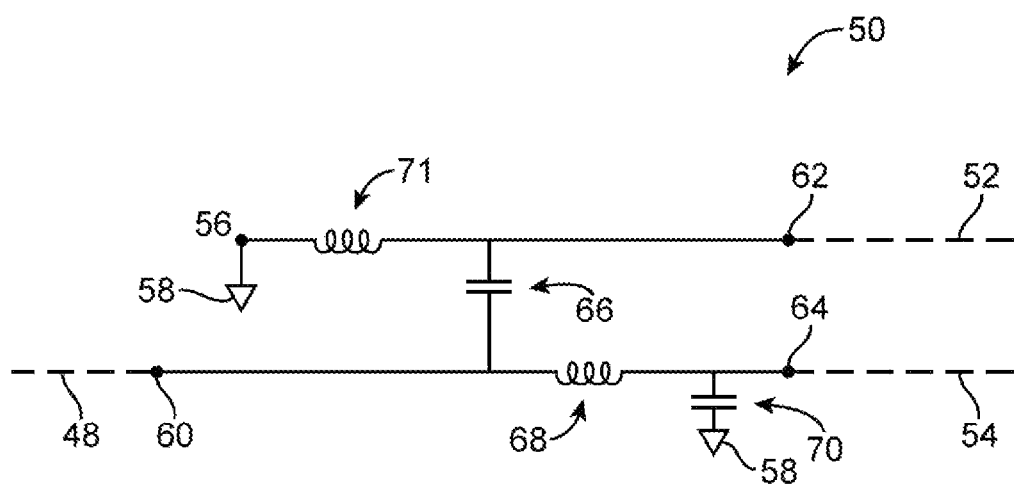
FIG. 4 is a circuit diagram of an illustrative passive coupler based on a balun in accordance with an embodiment of the present invention.

FIG. 4 is circuit diagram showing how passive coupler 50 may be based on a balun. Illustrative balun 50 has a first terminal such as terminal 62 that is coupled to path 52, a second terminal such as terminal 64 that is coupled to path 54, and a third terminal such as terminal 60 that is coupled to path 48. Components such as inductors 71 and 68 and capacitors 66 and 70 may be configured to form a splitting/combining circuit. Terminal 56 and capacitor 70 (in the illustrative configuration of FIG. 4) may be grounded to ground terminal 58. During operation, balun 50 of FIG. 4 (or other suitable passive coupler for device 10) may divide transmitted signals from path 48 into corresponding divided signals on paths 52 and 54 and may combine received signals on paths 52 and 54 into a combined signal on path 48. The illustrative passive coupler design of FIG. 4 is based on a balun, but, in general, passive coupler 50 may be formed from any suitable passive coupling circuitry. The example of FIG. 4 is merely illustrative.

If desired, device 10 may be implemented using a design for housing 12 and antennas 40 that tends to isolate antennas 40 from environmental effects. For example, device 10 may be implemented using an arrangement in which antennas 40 are substantially decoupled from housing 12 (e.g., using a design in which the antennas are housed away from the accessible surfaces of device 10 and housing 12) and are therefore relatively uninfluenced from contact between housing 12 and external objects such as a user's hand or other parts of a user's body. In other arrangements such as arrangements in which device 10 is implemented using a design that incorporates conductive portions of housing 12 into one or more of antennas 40 or a design in which antenna resonating elements for one or more of antennas 40 are implemented using structures that are otherwise located in the vicinity of the outer surfaces of device 10, the performance of antennas 40 may potentially be influenced by the presence (absence) of external objects. In configurations for the passively combined antenna of device 10 that are potentially influenced by the location of external objects relative to antenna structures 40, each portion of the combined antenna may potentially be individually affected by the presence of an external object.

Figure 5:
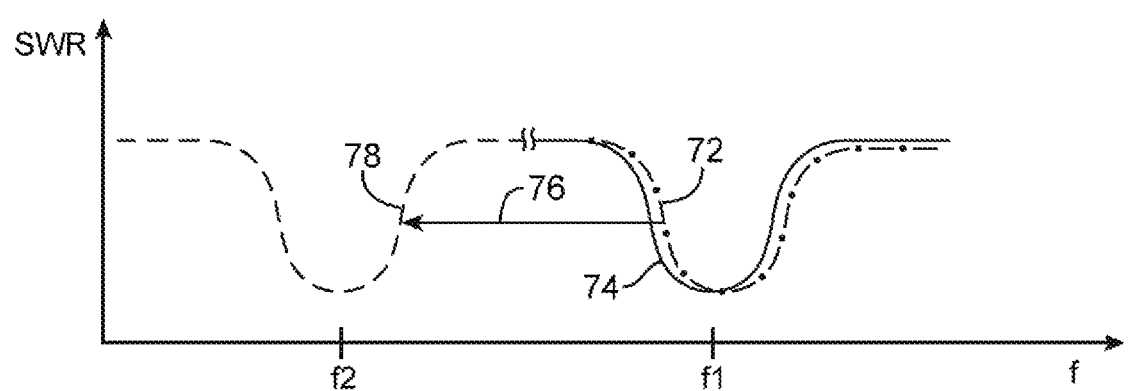
FIG. 5 is a graph in which standing wave ratio has been plotted for a pair of antennas as a function of frequency to show how antenna performance for one of the antennas may vary as that antenna is contacted by an external object in accordance with an embodiment of the present invention.

Antenna element performance (e.g., gain as a function of frequency) may be influenced by contact with an external object (e.g., direct contact of the object with a portion of antennas 40 or device 10 or contact of the external object by virtue of the presence of the object within a given distance of antennas 40). FIG. 5 is a graph showing how antenna performance may be influenced by contact with an external object in a scenario in which a first of the antenna elements that make up the combined antenna is contacted, but a second antenna element in the combined antenna is not contacted (or at least is contacted by an external object in a way that influences the second antenna element less than the first antenna element).

In the graph of FIG. 5, standing wave ratio (SWR) has been plotted as a function of antenna operating frequency f. Curve 72 in the graph of FIG. 5 and curve 74 in the graph of FIG. 5 may correspond, respectively, to antennas 40A and 40B in device 10 (as an example). Initially, when both antennas 40A and 40B in the combined antenna are not being contacted by an external object, antenna 40A may be characterized by response curve 72 and antenna 40B may be characterized by response curve 74. In this type of scenario, the performance of the antenna formed by passively combining antennas 40A and 40B using passive coupler 50 may be characterized by two overlapping curves peaking centered on a common resonant frequency (e.g., frequency f1 in the present example). When an external object contacts antenna 40A (in this example), the antenna response for antenna 40A is influenced by the external object. For example, the response of antenna 40A may shift from frequency f1 to frequency f2, as illustrated by line 76 and shifted antenna response curve 78 for antenna 40A.

As the example of FIG. 5 illustrates, the passively combined antenna may automatically adjust itself so that the contacted antenna element (e.g., antenna 40A in the FIG. 5 example) is detuned from the desired operating frequency of the antenna (frequency f1). The contacted antenna therefore tends to contribute relatively less to the performance of the passively combined antenna and the uncontacted antenna tends to contribute relatively more to the performance of the passively combined antenna at the operating frequency f1 that is being use by transceiver circuitry 46. Even though switching circuitry is not used to select between antennas 40A and 40B in this example, the detuning behavior exhibited by the contacted antenna will tend to automatically remove that antenna from use in the combined antenna during a contact event. When the affected antenna is no longer being contacted by an external object, performance may return to its nominal state. For example, when the external object is removed from antenna 40A, the performance of antenna 40A will shift back from curve 78 to curve 72 of FIG. 5, thereby restoring the passively combined antenna to its initial (untouched) configuration. The passively combined antenna may reconfigure itself in this way dynamically without the need to generate active switching commands using the processing circuitry of device 10 and without the need to interpose switching circuitry in antenna paths such as paths 52 and 54.

FIG. 6 is a table illustrating how a device that contains two antennas 40A and 40B that have been passively combined using coupler 50 may respond to a variety of contact conditions. In the FIG. 6 example, one of antennas 40A and 40B is located at upper end 22 of device 10 and is therefore referred to as an upper antenna (UAT). The other of antennas 40A and 40B in the FIG. 6 example is located at lower end 24 of device 10 and is therefore referred to as a lower antenna (LAT).

The table of FIG. 6 has three columns. Each column corresponds to a different set of environmental conditions. The first column of the table of FIG. 6 corresponds to a situation in which neither of the antennas is being contacted by an external object (i.e., both upper antenna UAT and lower antenna LAT are untouched by the user's body or other external objects). The second column of the table of FIG. 6 corresponds to a situation in which an external object such as a user's hand or other body part has been placed into contact with the lower antenna and has disrupted its normal performance. The third column of the table of FIG. 6 corresponds to a situation in which an external object such as a user's hand or other body part has been placed into contact with the upper antenna, so that the normal operation of the upper antenna has been blocked. The entries in the FIG. 6 table indicate the fraction of the antenna signal power that is being handle by each antenna.

In the FIG. 6 example, the upper and lower antennas have been configured so that when both the first and the second antennas are not contacted, the gains of the lower and upper antennas are such that the lower antenna handles 90% of the signal power transmitted (and received) by transceiver 46 and the upper antenna handles 10% of the signal power transmitted (and received) by transceiver 46. During typical use, the lower antenna LAT may be located farther from the user's head than the upper antenna, so using the lower antenna to handle most of the transmitted radio-frequency signal power may be desirable to ensure that device 10 satisfies government regulations for emitted radiation levels (i.e., specific absorption rate limits). In environmental conditions such as the conditions of the type illustrated by the second column of the table of FIG. 6, use of the lower antenna is not possible, because the lower antenna is blocked. As the "100%" entry in the second row of the second column of FIG. 6 indicates, however, when the lower antenna is blocked, the lower antenna may be detuned (as illustrated in connection with the detuning process of curves 72 and 78 of FIG. 5), so that substantially all transmitted and received radio-frequency signals are handled by the uncovered upper antenna. In the scenario of the third column of FIG. 6, the upper antenna is blocked by the external object. This detunes the upper antenna, so that the lower antenna in the passively combined antenna is automatically used in handling transmitted and received signals.

If desired, other types of configurations may be used for the upper and lower antennas. In the FIG. 6 example, the nominal gain ratio of the upper and lower antennas is 90/10. This is merely illustrative. The nominal (uncontacted) gain ratio may be less than 90/10 (e.g., 70/30 or less, 50/50 or less, etc.) or may be more than 90/10 (e.g., 95/5), more than 50/50, more than 70/30, etc.

Figure 7:
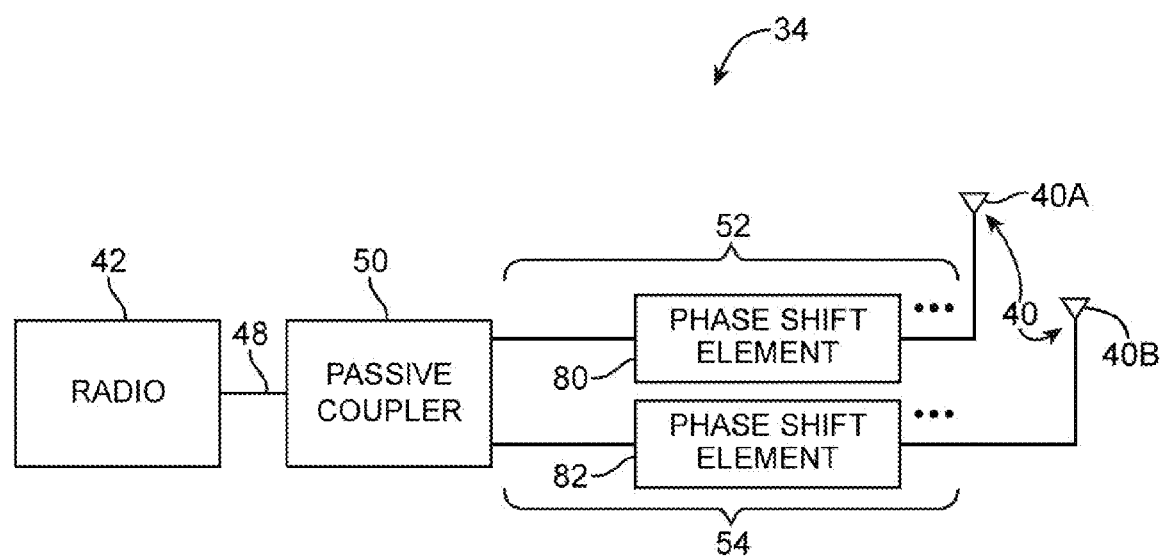
FIG. 7 is a diagram showing how antenna performance may be tuned using phase shifting elements that are interposed between a passive coupler and respective antennas in accordance with an embodiment of the present invention.

If desired, one or more phase-shifting elements may be interposed within paths such as paths 52 and 54 of wireless circuitry 34 (FIG. 3) to adjust the overall performance of the passively combined antennas. An illustrative configuration of this type that may be used for wireless circuitry 34 of device 10 is shown in FIG. 7. As shown in FIG. 7, path 52 may contain one or more optional phase-shifting components such as phase shift element 80 and path 54 may contain one or more optional phase-shifting components such as phase shift element 82. Phase shift elements such as elements 80 and 82 may be formed from lengths of transmission line, passive circuits formed from components such as inductors, capacitors, and resistors, or other suitable phase-shifting circuitry that adjusts the relative phase between the signals received at coupler 50 from antenna 40A and the signals received at coupler 50 from antenna 40B.

Figure 8:
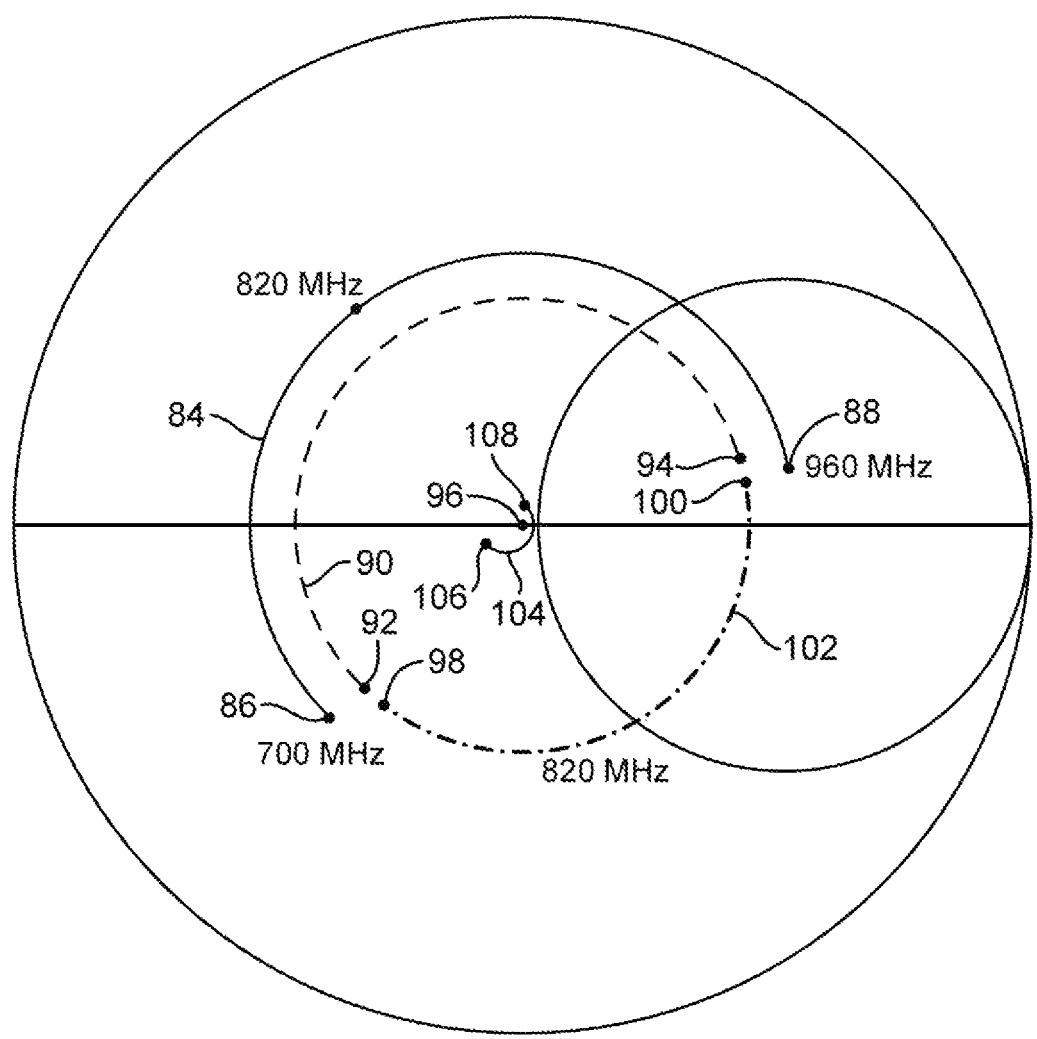
FIG. 8 is a Smith chart showing how the performance of an antenna formed by passively combining a pair of antennas may be adjusted using a phase shift element of the type shown in FIG. 7 in accordance with an embodiment of the present invention.

The impact of phase shifting elements in the paths between passive coupler 50 and antennas 40 is illustrated in the example of FIG. 8. FIG. 8 is a Smith chart in which complex impedance has been plotted as a function of frequency for various antenna configurations. Solid line 84 corresponds to the impedance of a first antenna such as antenna 40A of FIG. 7 in the absence of phase shift element 80 in path 52 and ranges from first point 86 to second point 88, as operating frequency f changes from 700 MHz to 960 MHz (in this example). Dashed line 90 corresponds to the impedance of a second antenna such as antenna 40B of FIG. 7 in the absence of phase shift element 82 in path 54 and ranges from first point 92 to second point 94 as operating frequency f ranges from 700 MHz to 960 MHz. (The upper and lower frequency limits of 700 MHz and 960 MHz are merely illustrative.).

A suitable impedance for the combined antenna that is formed by combining antennas 40A and 40B is represented by fixed impedance point 96. An antenna with a fixed impedance (e.g., 50 Ohms, 100 Ohms, or other suitable impedance value) across a range of operating frequencies can be satisfactorily impedance matched to transmission lines such as transmission line paths 52 and 54 across that range of frequencies. In the absence of phase shifting elements 80 and 82 (in the present example), the impedance of the combined antennas 40A and 40B would be close to the values represented by lines 84 and 90, and would not closely match desired fixed impedance 96. By incorporating an appropriate 180° phase shifting element such as phase-shift element 82 into path 54, however, the impedance of antenna 40B (and the phase-shift element) may be transformed into that of line 102, starting at point 98 (at 700 MHz) and ranging to point 100 (at 960 MHz). When the impedance of path 52 and antenna 40A (line 84) is combined with the impedance of path 54 (including 180° phase-shift element 82) and antenna 40B (line 102), the resulting impedance is represented by a curve such as curve 104. Endpoint 106 of curve 104 is associated with operation at 700 MHz. Endpoint 108 of curve 104 is associated with operation at 960 MHz. Even across is entire operating range (frequencies from 700 MHz to 960 MHz in the present example), the combined impedance represented by curve 104 never varies significantly from desired impedance value 96, ensuring that the antenna formed by passively combined antennas 40A and 40B will be well impedance matched to path 48 and other circuitry within wireless circuitry 34 and will perform satisfactorily in device 10.

Figure 9:
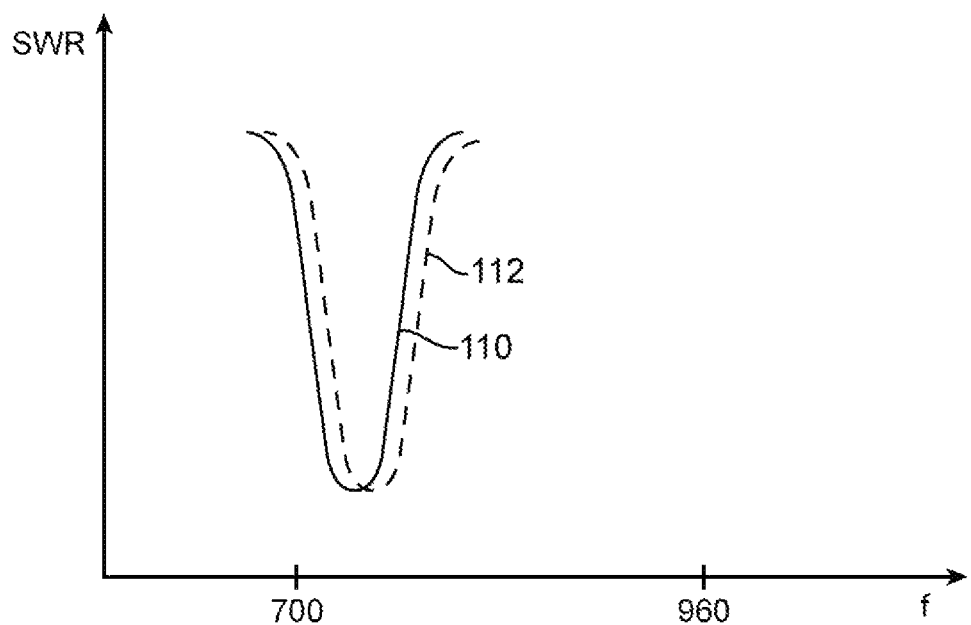
FIG. 9 is a graph showing how first and second antennas may perform as a function of frequency in accordance with an embodiment of the present invention.
Figure 10:
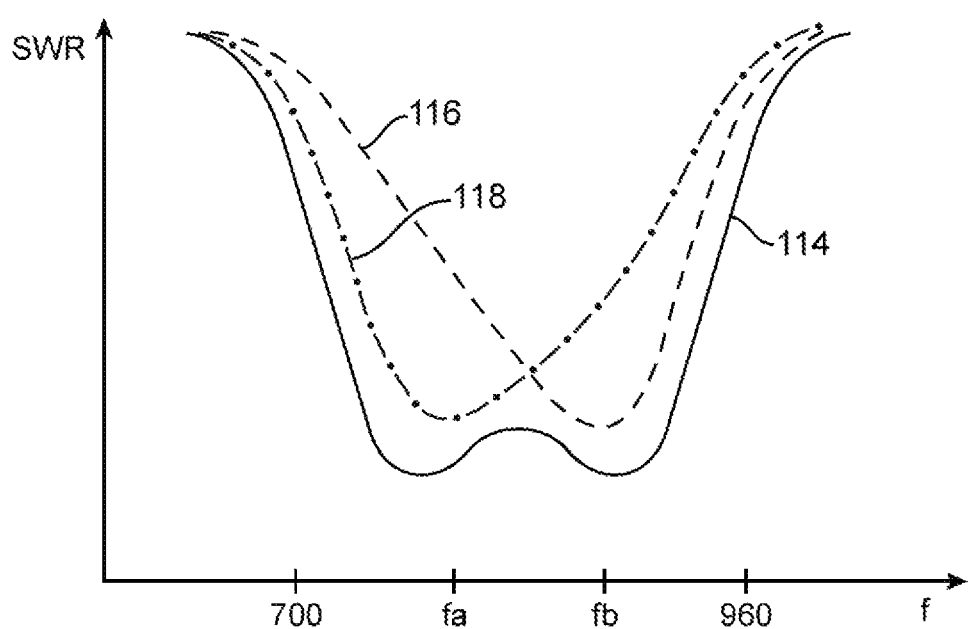
FIG. 10 is a graph showing how the first and second antennas of FIG. 9 may perform as a combined pair when coupled together using a passive coupler arrangement in accordance with an embodiment of the present invention.

FIG. 9 is a graph showing how the performance of antennas 40A (line 110) and 40B (line 112) may be configured to overlap. When it is desired to broaden the bandwidth of the frequency range that is covered by the combined antenna structures, antennas 40A and 40B may be configured to have resonant peaks at different frequencies. As shown in FIG. 10, for example, antenna 40A may be configured to cover a frequency band that is centered at frequency fa, whereas antenna 40B may be configured to cover a frequency band that is centered at frequency fb. The resulting frequency response of the antenna for device 10 that is formed by combining antennas 40A and 40B using passive coupler 50 (line 114) may cover a broadened range of frequencies. When the performance of antenna 40B is degraded due to contact with an external object, the overall performance of the passively combined antenna may be represented by line 118. When the performance of antenna 40A is degraded due to contact with an external object, the overall performance of the passively combined antenna may be represented by line 116.

Figure 11:
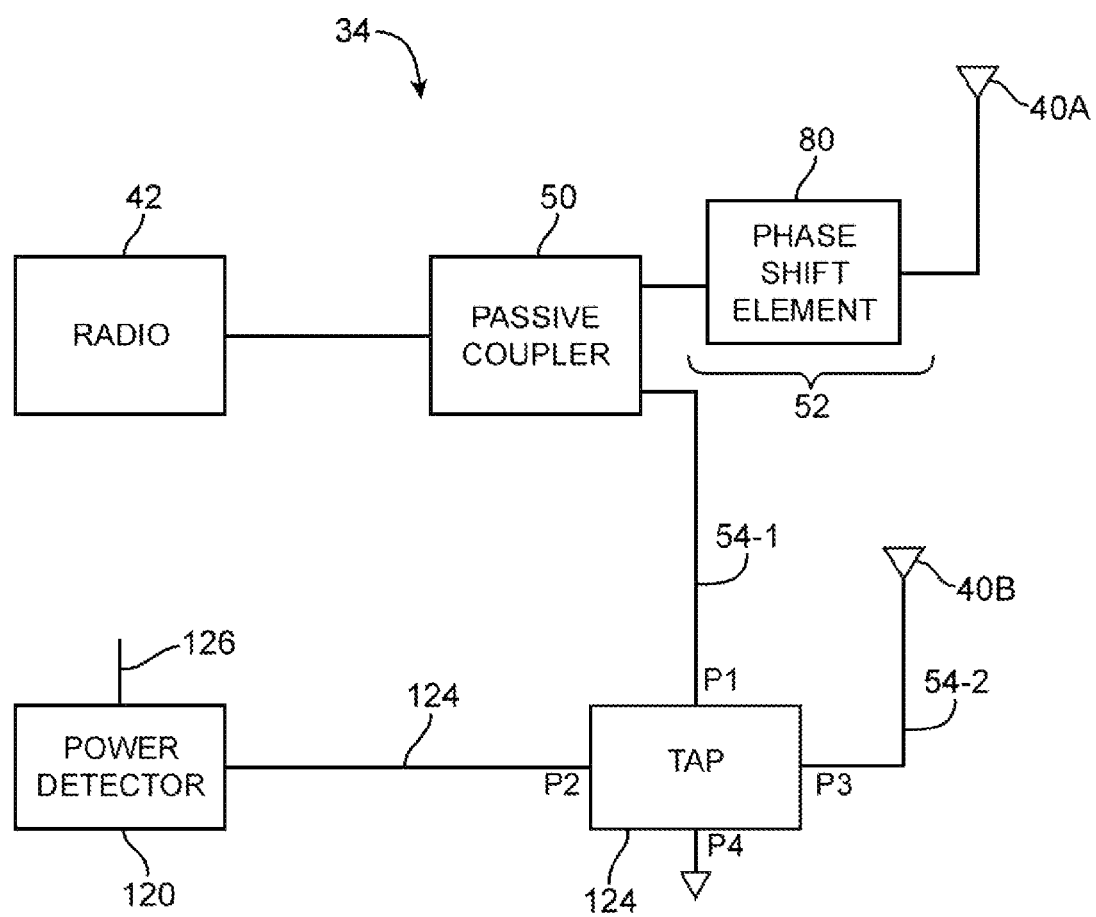
FIG. 11 is a schematic diagram of an illustrative circuit that may be used in monitoring radio-frequency signals associated with an antenna having multiple antennas that are combined using a passive coupler in accordance with an embodiment of the present invention.

Because antennas 40A and 40B may be subject to detuning effects of the type described in connection with curves 72 and 78 of FIG. 5, it may be desirable to provide device 10 with circuitry for monitoring the state of one or both antennas. As shown in FIG. 11, for example, wireless circuitry 34 may be provided with a tap such as radio-frequency tap 124. Taps such as tap 124 may be interposed in path 52, path 54, or both path 52 and 54 (as examples).

As shown in FIG. 11, path 54 (FIG. 7) may be formed from path segment 54-1 and path segment 54-2. Radio-frequency tap 124 may be interposed in the path formed from paths 54-1 and 54-2 to monitor the power of radio-frequency signals being conveyed between passive coupler 50 and antenna 40B (e.g., to monitor transmitted radio-frequency signal power when transmitting signals using the radio-frequency transmitter in radio 42). Radio-frequency tap 124 may have a first port such as port P1 that is coupled by path 54-1 to passive coupler 50, a second port such as port P2 that is coupled by path 124 to power detector 120, a third port such as port P3 that is coupled by path 54-2 to antenna 40B, and a fourth port such as port P4 (e.g., a grounded port). During operation, radio 42 may transmit radio-frequency signals through antenna 40B. Tap 124 may divert a fraction (e.g., 1-10%, less than 2%, more than 2%, or other suitable fraction) of the radio-frequency signal power that is being provided to antenna 40B for transmission to power detector 120. Power detector 120 may measure the magnitude of the tapped signal and, based on this feedback measurement, may provide control circuitry in device 10 such as baseband processor 44 and/or storage and processing circuitry 28 with power measurement feedback data on output path 126. The control circuitry may use the measured transmit power information to adjust the transmitted power to a desired level. The tapping scheme of FIG. 11 avoids potential uncertainties that might otherwise result when transmitting radio-frequency signals through antenna structures such as the antenna formed by passively combining antennas 40A and 40B that have the potential to be detuned when contacted by an external object. If desired, taps may be provided in both paths 52 and 54, so that the control circuitry can monitor the ratio of signal powers between antennas 40A and 40B.

The foregoing is merely illustrative of the principles of this invention and various modifications can be made by those skilled in the art without departing from the scope and spirit of the invention.

What is claimed is:

1. An electronic device, comprising:
   at least first and second antennas;
   radio-frequency transceiver circuitry; and
   a passive coupler having a first port coupled to the first antenna, a second port coupled to the second antenna, and a third port coupled to the radio-frequency transceiver circuitry, wherein the radio-frequency transceiver circuitry is configured to transmit and receive radio-frequency signals via the passive coupler, and wherein the first and second antennas are configured to exhibit a gain ratio of greater than 50/50 when not being contacted by external objects.

2. The electronic device defined in claim 1 wherein the first port of the passive coupler is coupled to the first antenna without any intervening electrically controlled switches and wherein second port of the passive coupler is coupled to the second antenna without any intervening electrically controlled switches.

3. The electronic device defined in claim 2 wherein the radio-frequency transceiver circuitry comprises cellular telephone transceiver circuitry.

4. The electronic device defined in claim 3 further comprising a substantially rectangular housing, wherein the first antenna and second antenna are located at opposing ends of the substantially rectangular housing.

5. An electronic device, comprising:
   at least first and second antennas;
   radio-frequency transceiver circuitry;
   a passive coupler having a first port coupled to the first antenna, a second port coupled to the second antenna, and a third port coupled to the radio-frequency transceiver circuitry, wherein the radio-frequency transceiver circuitry is configured to transmit and receive radio-frequency signals via the passive coupler, and wherein radio-frequency signals from the first and second antennas are received at the first and second ports with a relative phase;

a transmission line path between the second port and the second antenna; and a phase shift element interposed in the transmission line path between the second port and the second antenna that adjusts the relative phase to be about 180°.

6. The electronic device defined in claim 1 wherein the first and second antennas are configured to exhibit a gain ratio of greater than 70/30 when not being contacted by external objects.

7. The electronic device defined in claim 1 further comprising a radio-frequency tap interposed in a path between the second port and the second antenna.

8. The electronic device defined in claim 7 further comprising a power detector that measures radio-frequency signals that are tapped from the path by the radio-frequency tap.

9. The electronic device defined in claim 1 wherein the passive coupler comprises a circuit selected from the group consisting of: a Wilkinson divider, a balun circuit, a directional coupler, and a split transmission line.

10. A method for receiving wireless signals in a portable electronic device, comprising:
    with a first antenna in the portable electronic device, receiving first radio-frequency signals;
    with a second antenna in the portable electronic device, receiving second radio-frequency signals;
    routing the first and second radio-frequency signals from the first and second antennas to respective first and second ports of a passive coupler without passing through any electrically controlled switching circuitry;
    combining the first and second radio-frequency signals with the passive coupler to produce a corresponding passively combined radio-frequency signal at an output of the passive coupler;
    receiving the combined radio-frequency signal with a radio-frequency transceiver in the portable electronic device;
    transmitting radio-frequency signals with the radio-frequency transceiver; with the passive coupler, dividing the transmitted radio-frequency signals into respective first and second radio-frequency signal portions; and
    in response to contact with the portable electronic device by an external object in the vicinity of the first antenna, receiving an increased amount of the second radio-frequency signals relative to the first radio-frequency signals.

11. The method defined in claim 10 further comprising:
    routing the first radio-frequency signal portion from the first port of the passive coupler to the first antenna without passing through any electrically controlled switches; and
    routing the second radio-frequency signal portion from the second port of the passive coupler to the second antenna without passing through any electrically switches.

12. The method defined in claim 11 wherein the portable electronic device comprises a cellular telephone, wherein the radio-frequency transceiver comprises a cellular telephone transceiver, and wherein transmitting the radio-frequency signals from the radio-frequency transceiver comprises transmitting cellular telephone signals.

13. The method defined in claim 10 wherein receiving the increased amount of the second radio-frequency signals relative to the first radio-frequency signals comprises receiving the increased amount of the second radio-frequency signals relative to the first radio-frequency signals without adjusting any switches in the portable electronic device.

14. The method defined in claim 10 further comprising:
    making signal power measurements using a tap that is interposed in a path between the second port and the second antenna.

15. A wireless electronic device, comprising:
    a passive radio-frequency signal coupler;
    a first antenna coupled to a first port of the passive radio-frequency signal coupler;
    a second antenna coupled to a second port of the passive radio-frequency signal coupler; and
    a radio-frequency transceiver coupled to a third port of the passive radio-frequency signal coupler, wherein transmitted signals from the radio-frequency transceiver are divided by the passive radio-frequency signal so that a first portion of the transmitted signals is provided to the first antenna through the first port and so that a second portion of the transmitted signals is simultaneously provided to the second antenna through the second port, wherein signals received by the first and second antennas are combined using the passive radio-frequency signal coupler and are received by the radio-frequency transceiver, wherein the received signals exhibit a given frequency, wherein the first and second antennas are tuned to the given frequency when no object is in contact with the wireless electronic device in the vicinity of the first antenna, and wherein the first antenna is automatically detuned from the given frequency when an external object is in contact with the wireless electronic device in the vicinity of the first antenna.

16. The wireless electronic device defined in claim 15 further comprising a radio-frequency tap interposed between the second port and the second antenna.

17. The wireless electronic device defined in claim 16 further comprising a power detector coupled to the radio-frequency tap to make power measurements on radio-frequency signals from the tap.

18. The wireless electronic device defined in claim 17 wherein the radio-frequency transceiver comprises a cellular telephone transceiver.

* * * * *

UNITED STATES PATENT AND TRADEMARK OFFICE
CERTIFICATE OF CORRECTION

PATENT NO. : 8,532,697 B2  Page 1 of 1
APPLICATION NO. : 13/117050
DATED : September 10, 2013
INVENTOR(S) : Mattia Pascolini It is certified that error appears in the above-identified patent and that said Letters Patent is hereby corrected as shown below:

In the Claims

In claim 11, column 13, line 53, delete "any electrically switches" and insert -- any electrically controlled switches --

Signed and Sealed this
Twenty-first Day of October, 2014

Michelle K. Lee
*Deputy Director of the United States Patent and Trademark Office*